(12) United States Patent
Kim (10) Patent No.: US 9,373,380 B2
(45) Date of Patent: Jun. 21, 2016

(54) MULTI-PORT SEMICONDUCTOR MEMORY DEVICE WITH MULTI-INTERFACE

(71) Applicant: Samsung Electronics Co., Ltd., Samsung-ro, Yeongtong-gu, Suwon-si, Gyeonggi-do (KR)

(72) Inventor: Jin-Hyun Kim, Yongin-si (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 310 days.

(21) Appl. No.: 14/034,994

(22) Filed: Sep. 24, 2013

(65) Prior Publication Data

US 2014/0098613 A1     Apr. 10, 2014

(30) Foreign Application Priority Data

Oct. 4, 2012   (KR) .......................... 10-2012-0110123

(51) Int. Cl.
| | | |
|---|---|---|
| *G11C 11/00* | (2006.01) | |
| *G11C 8/16* | (2006.01) | |
| *G11C 7/10* | (2006.01) | |
| *G11C 14/00* | (2006.01) | |
| *G11C 13/00* | (2006.01) | |

(52) U.S. Cl.
CPC ............... *G11C 8/16* (2013.01); *G11C 7/1075* (2013.01); *G11C 11/005* (2013.01); *G11C 14/0009* (2013.01); *G11C 14/0018* (2013.01); *G11C 14/0036* (2013.01); *G11C 13/0002* (2013.01)

(58) Field of Classification Search
CPC .... G11C 8/16; G11C 13/003; G11C 14/0036; G11C 7/1075; G11C 14/009; G11C 13/0002
See application file for complete search history.

(56) References Cited

U.S. PATENT DOCUMENTS

| | | |
|---|---|---|
| 6,609,174 B1 | 8/2003 | Naji |
| 7,356,654 B2 | 4/2008 | Fukuzo |
| 7,715,269 B2 | 5/2010 | Kajigaya |
| 7,736,234 B2 | 6/2010 | Cockerille et al. |
| 7,840,762 B2 | 11/2010 | Oh et al. |
| 7,953,920 B2 | 5/2011 | Yano et al. |
| 2005/0152192 A1 | 7/2005 | Boldy et al. |
| 2006/0279984 A1 | 12/2006 | Seta et al. |
| 2008/0306723 A1 | 12/2008 | De Ambroggi et al. |
| 2009/0109787 A1 | 4/2009 | Rao |
| 2009/0254698 A1* | 10/2009 | Kwon .................. G11C 11/413 711/105 |
| 2010/0191898 A1 | 7/2010 | Kim et al. |
| 2011/0035575 A1 | 2/2011 | Kwon |

(Continued)

FOREIGN PATENT DOCUMENTS

| | | |
|---|---|---|
| JP | 2008-052370 | 3/2008 |
| KR | 1020060090088 A | 8/2006 |

(Continued)

*Primary Examiner* — Ernest Unelus
(74) *Attorney, Agent, or Firm* — Muir Patent Law, PLLC (57) ABSTRACT

A semiconductor memory device is provided which includes a first port configured to connect to a first processor and including a first interface circuit; a second port configured to connect to a second processor and including a second interface circuit; and a memory cell array including a first memory area connected to the first and second ports in common. The first memory area includes a plurality of magneto-resistive random access memory cells. The first interface circuit is configured to receive a DRAM interface signals, and the second interface circuit is configured to receive a flash memory interface signals.

19 Claims, 11 Drawing Sheets

(56) References Cited

U.S. PATENT DOCUMENTS

2011/0170362 A1 7/2011 Takahashi
2011/0228594 A1* 9/2011 Rao .......................... G11C 8/16
                                                                    365/158

FOREIGN PATENT DOCUMENTS

| KR | 1020080108049 A | 12/2008 |
| KR | 1020100086776 A | 8/2010 |

* cited by examiner

MULTI-PORT SEMICONDUCTOR MEMORY DEVICE WITH MULTI-INTERFACE

CROSS-REFERENCE TO RELATED APPLICATIONS

This application claims priority under 35 U.S.C. §119(a) to Korean Patent Application No. 10-2012-0110123 filed Oct. 4, 2012, in the Korean Intellectual Property Office, the entire contents of which are hereby incorporated by reference.

BACKGROUND

This disclosure relates to a semiconductor memory device, and more particularly, to a multi-port semiconductor memory device.

A volatile semiconductor memory device such as a random access memory (for example, a DRAM) may be widely used as a main memory of a memory system (e.g., a mobile device or a computer).

A nonvolatile semiconductor memory device such as a flash memory may be used to back up data of a main memory or to store program data in the memory system.

A memory system including a DRAM, a flash memory, and a memory control device may be embedded in or connected with a host device such as a microprocessor through a port. In general, a performance of the memory system may be reduced as data are frequently transferred between the DRAM and flash memory.

It is desirable to improve the performance of a memory system with minimum changes the interface circuit used in current systems.

SUMMARY

According to exemplary embodiments, a semiconductor memory device is provided. The semiconductor memory device includes a first port, a second port, and a memory cell array. The first port is configured to connect to a first processor and including a first interface circuit. The second port is configured to connect to a second processor and including a second interface circuit. The memory cell array includes a first memory area connected to the first and second ports in common. The first memory area includes a plurality of magneto-resistive random access memory (MRAM) cells. The first interface circuit is configured to receive a DRAM interface signals, and the second interface circuit is configured to receive a flash memory interface signals.

According to exemplary embodiments, a semiconductor memory device is provided. The semiconductor memory device includes a first port, a second port, and a memory cell array. The first port includes a first interface circuit, and is configured to connect to a first processor. The second port includes a second interface circuit, and is configured to connect to a second processor. The memory cell array includes a plurality of magneto-resistive random access memory (MRAM) cells. The first memory area is connected to the first port and not the second port and the second memory area is connected to the second port and not the first port. The third memory area is connected to the first and second ports. The first interface circuit is configured to convert signals used in dynamic random access memory (DRAM) into signals used in MRAM. The second interface circuit is configured to convert signals used in flash memory into signals used in MRAM.

According to exemplary embodiments, a method of accessing data stored in a semiconductor memory device is provided. The method includes: converting signals used in dynamic random access memory (DRAM) into signals used in magneto-resistive random access memory (MRAM) by using a first port; converting signals used in flash memory into signals used in MRAM by using a second port; accessing data stored in a first memory area of the semiconductor memory device by a first processor through the first port; accessing data stored in a second memory area different from the first memory area of the semiconductor memory device by a second processor through the second port; and accessing data stored in a third memory area different from the first and second memory areas by the first and second processors through the first and second ports, respectively. Each of the first through third memory areas includes a plurality of MRAM cells.

BRIEF DESCRIPTION OF THE FIGURES

Exemplary embodiments will be more clearly understood from the following detailed description taken in conjunction with the accompanying drawings.

DETAILED DESCRIPTION

Embodiments will be described in detail with reference to the accompanying drawings. The inventive concept, however, may be embodied in various different forms, and should not be construed as being limited only to the illustrated embodiments. Accordingly, known processes, elements, and techniques are not described with respect to some of the embodiments disclosed herein. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. Unless indicated otherwise, these terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed therein may include their complementary embodiments. Note that details of data access operations and internal function circuits associated with a NAND flash memory, a DRAM, and an MRAM may be skipped.

Figure 1:
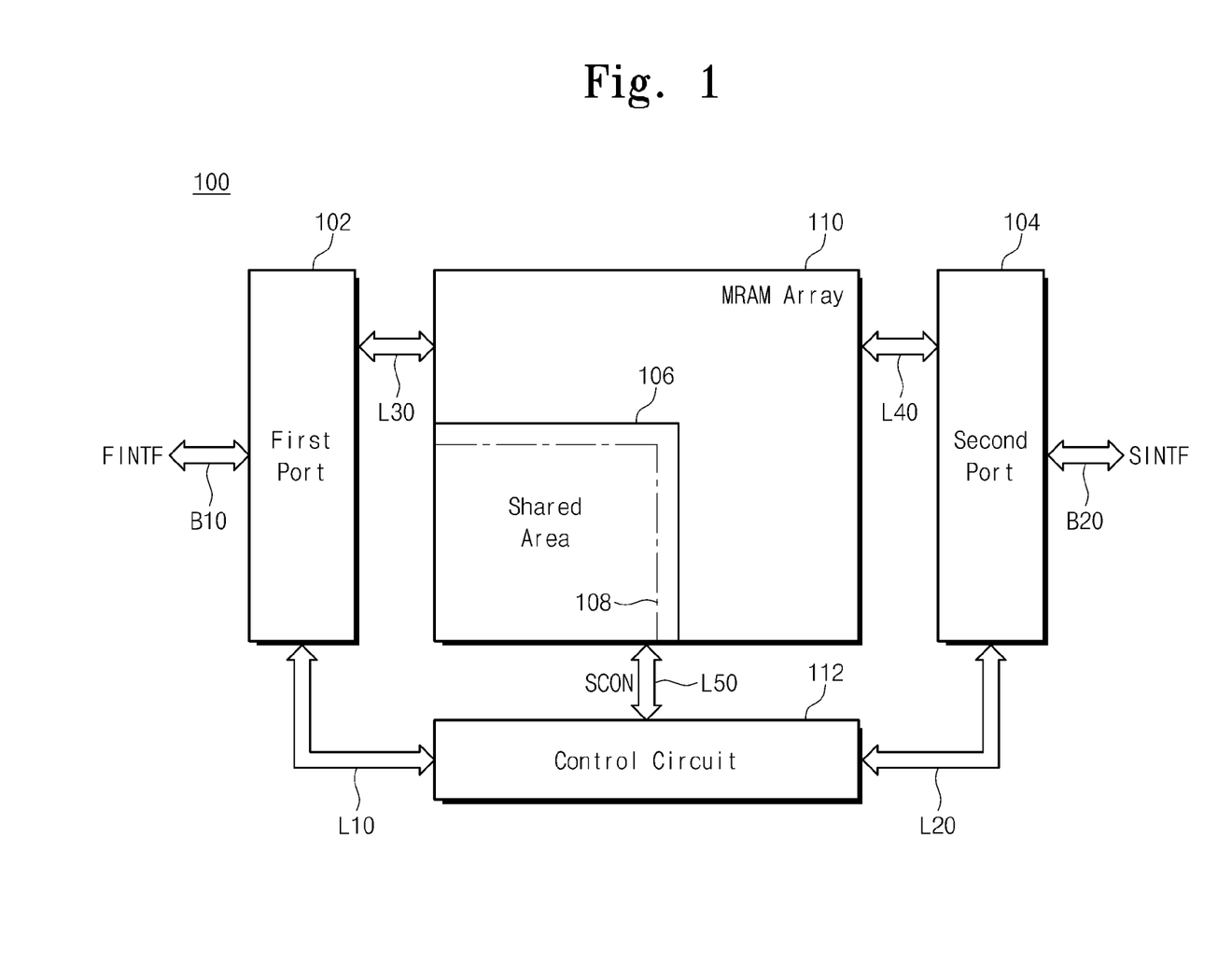
FIG. 1 is a block diagram schematically illustrating a semiconductor memory device according to an embodiment.

FIG. 1 is a block diagram schematically illustrating a semiconductor memory device according to an embodiment.

Referring to FIG. 1, a semiconductor memory device 100 may include a first port 102, a second port 104, a magnetoresistive random access memory (MRAM) array 110 including a shared area 106, and a control circuit 112. The MRAM array 110 includes a plurality of MRAM cells. For example, the semiconductor memory device 100 may be a multiport semiconductor memory device. An example of a multiport semiconductor memory device is described in U.S. Pat. No. 8,122,199 to Jin-Hyoung KWON et al., assigned to Samsung Electronics Co. Ltd., and entitled "Multiport Memory Device with Shred Memory Area using Latch Type Memory Cells and Driving Method," issued on Feb. 21, 2012.

The first port 102 may have a first interface FINTF, and the second port 104 may have a second interface SINFT different from the first interface FINTF. For example, the first port 102 may be connected with a first processor and have an interface of a volatile memory device such as a dynamic random access memory (DRAM). Also, the second port 104 may be connected with a second processor and have an interface of a nonvolatile memory device such as a NAND flash memory.

The MRAM array 110 may be accessed by the first and second processors through the first and second ports 102 and 104. The MRAM array 110 may include the shared area 106, the memory size of which is variable. The semiconductor memory device 100 with the MRAM array may include multiple ports and different interfaces to perform roles of a DRAM and a flash memory.

Under the control of the control circuit 112, the shared area 106 may be operationally connected with the first port 102 through a line L30 or with the second port 104 through a line L40. In the event that an increase or decrease in a data storage capacity of the shared area 106 is required through lines L10 and L20, the control circuit 112 may apply a size control signal SCON to the MRAM array 110 through a line L50.

If the MRAM array 110 includes dedicated memory areas, a first dedicated memory area may be connected with the first port 102, and the first port 102 may be connected with the first processor through a first bus B10. Meanwhile, a second dedicated memory area may be connected with the second port 104, and the second port 104 may be connected with the second processor through a second bus B20.

Since the semiconductor memory device 100, and in particular the shared area 106, with the MRAM array is accessed by processors through different interfaces, a data transfer time when data is transferred between the processors may be minimized or reduced. For example, in the event that data stored in the shared area 106 is internally transferred to the second dedicated memory area in the MRAM array 110, a data transfer time or path may be reduced in comparison with the event that data of a typical main memory is backed up to a flash memory. Thus, a latency time may be reduced.

Also, since one memory device is used as a DRAM and a flash memory, a size of a system may be scaled down, so that a cost necessary to implement the system is reduced. In addition, since it is used without change of an existing processor or CPU, the compatibility may be improved.

Figure 2:
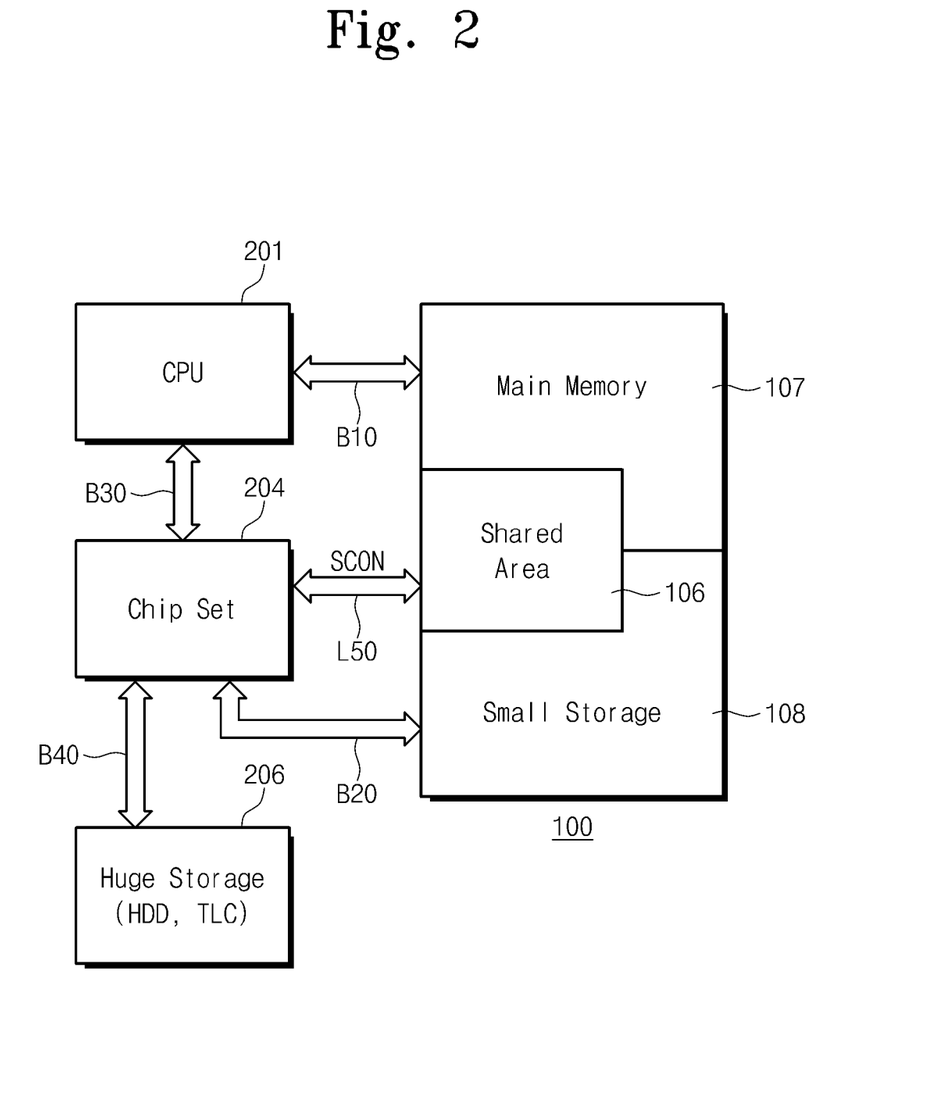
FIG. 2 is a block diagram schematically illustrating a data processing system including a semiconductor memory device of FIG. 1 according to an embodiment.

FIG. 2 is a block diagram schematically illustrating a data processing system including a semiconductor memory device of FIG. 1 according to an embodiment.

Referring to FIG. 2, a data processing system may include a semiconductor memory device 100, a CPU 201, a chipset 204, and huge storage 206. The semiconductor memory device 100 may be the same as a semiconductor memory device of FIG. 1.

A first dedicated memory area 107 of the semiconductor memory device 100 may be connected with the CPU 201 through a bus B10. For example, the first dedicated memory area 107 may include an MRAM array having a plurality of MRAM cells. In this case, the first dedicated memory area 107 may function as a main memory of the CPU 201 in a similar manner as a DRAM. The bus B10 may be connected with a first port including a DRAM interface.

A second dedicated memory area 108 of the semiconductor memory device 100 may be connected with the chipset 204 through a bus B20. For example, the second dedicated memory area 108 may include an MRAM array having a plurality of MRAM cells. In this case, the second dedicated memory area 108 may function as a small storage in a similar manner as a NAND flash memory. The bus B20 may be connected with a second port including a NAND interface.

A shared area 106 of the semiconductor memory device 100 may be connected with the CPU 201 and the chipset 204 through the bus B10 and B20, respectively. In one embodiment, the shared area 106 may include an MRAM array having a plurality of MRAM cells.

The chipset 204 may be connected with the CPU 201 through a bus B30 and with the huge storage 206 through a bus B40, and may function as a memory controller.

Huge storage 206 may be, for example, a hard disk drive (HDD) or triple level cell device (TLC), typically capable of storing a much lager amount of data than a main memory or flash memory. In FIG. 2, since the semiconductor memory device 100 with an MRAM array having a plurality of MRAM cells includes multiple ports and different interfaces, and may be used as both a DRAM and a flash memory (e.g., to perform functions normally performed by a DRAM and to also perform functions normally performed by a flash memory).

In the event that an increase or decrease in a data storage capacity of the shared area 106 is required, the control circuit 112 may apply a size control signal SCON to the semiconductor memory device 100 through the line L50.

In an MRAM array 110 of the semiconductor memory device 100, the first dedicated memory area 107 may be connected with the CPU 201, the second dedicated memory area 108 may be connected with the chipset 204, and the shared area 106 may be connected with both of the CPU 201 and chipset 204.

Since the semiconductor memory device 100, and in particular the shared area 106, is accessed by the CPU 201 and the chipset 204 through different interfaces, a data transfer time or path may be reduced or minimized when data is transferred between the CPU 201 and the chipset 204. Thus, a latency time may be reduced.

Also, since a memory device is used as a DRAM and a flash memory, a size of the data processing system may be scaled down, so that a cost necessary to implement the data processing system is reduced. In addition, since it is used without change of an existing processor or CPU, the compatibility may be bettered.

Figure 3:
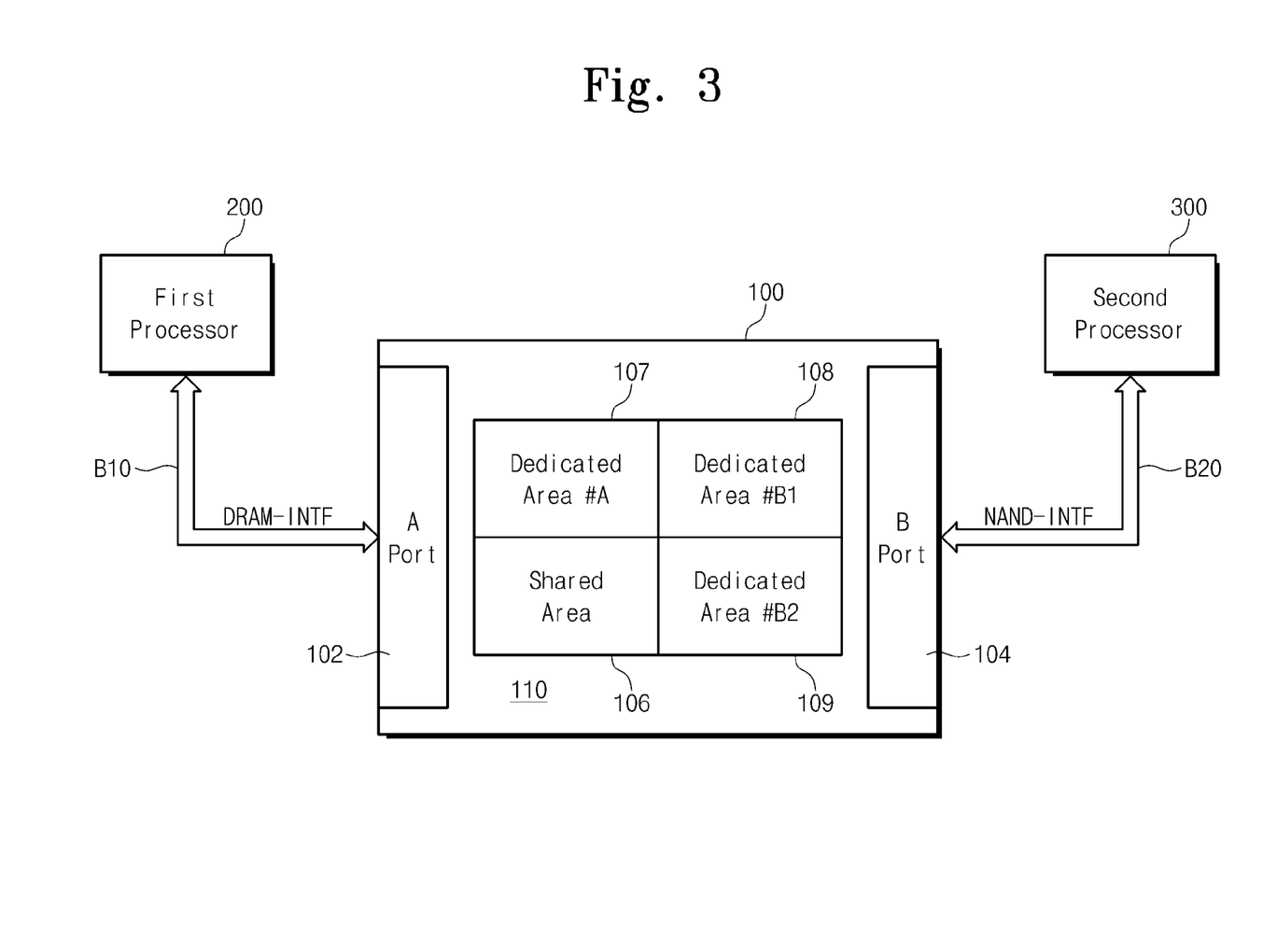
FIG. 3 is a block diagram schematically illustrating a multi-processor system including a semiconductor memory device of FIG. 1 according to an embodiment.

FIG. 3 is a block diagram schematically illustrating a multi-processor system including a semiconductor memory device of FIG. 1 according to an embodiment.

Referring to FIG. 3, a multi-processor system may include a semiconductor memory device 100, a first processor 200, and a second processor 300.

The semiconductor memory device 100 may include an A port 102, a B port 104, and an MRAM array 110 including a shared area 106, a first dedicated memory area 107, and second dedicated memory areas 108 and 109.

A first processor 200 may be connected with the A port 102 through a first bus B10. A second processor 300 may be connected with the B port 104 through a second bus B20.

A DRAM interface DRAM-INTF may be provided between the first processor 200 and the A port 102.

A NAND interface NAND-INTF may be provided between the second processor 300 and the B port 104.

As an MRAM type of semiconductor memory device, the semiconductor memory device 100 may include multiple ports and different interfaces to perform roles of a DRAM and a flash memory.

The shared area 106 may be accessed by the first processor 200 through the A port 102 and by the second processor 300 through the B port 104. For example, when using the shared area 106, the A port 102 may convert signals used in DRAM into signals used in MRAM. The first processor 200 may access data stored in the shared area 106 through the A port 102 and the second processor 300 may access data stored in the shared area 106 through the B port 104.

In one embodiment, the first dedicated memory area 107 is accessed only by the first processor 200 through the A port 102. For example, when using the first memory area 107, the A port 102 may convert signals used in DRAM into signals used in MRAM and the first processor 200 may access data stored in the first memory area 107 through the A port 102.

In one embodiment, the second dedicated memory areas 108 and 109 are accessed only by the second processor 300 through the B port 104. For example, when using the second memory areas 108 and 109, the B port 104 may convert signals used in flash memory into signals used in MRAM and the second processor 300 may access data stored in the second memory areas 108 and 109 through the B port 104.

Since the semiconductor memory device 100, and in particular the shared area 106, with an MRAM array having a plurality of MRAM cells is accessed by processors through different interfaces, a data transfer time or path may be reduced or minimized when data is transferred between the processors. Thus, a latency time of a system may be reduced.

Also, since a memory device is used as a DRAM and a flash memory, a size of the system may be scaled down, so that a cost necessary to implement the system is reduced. In addition, since it is used without changing interconnection between existing processors, the compatibility may be improved.

Figure 4:
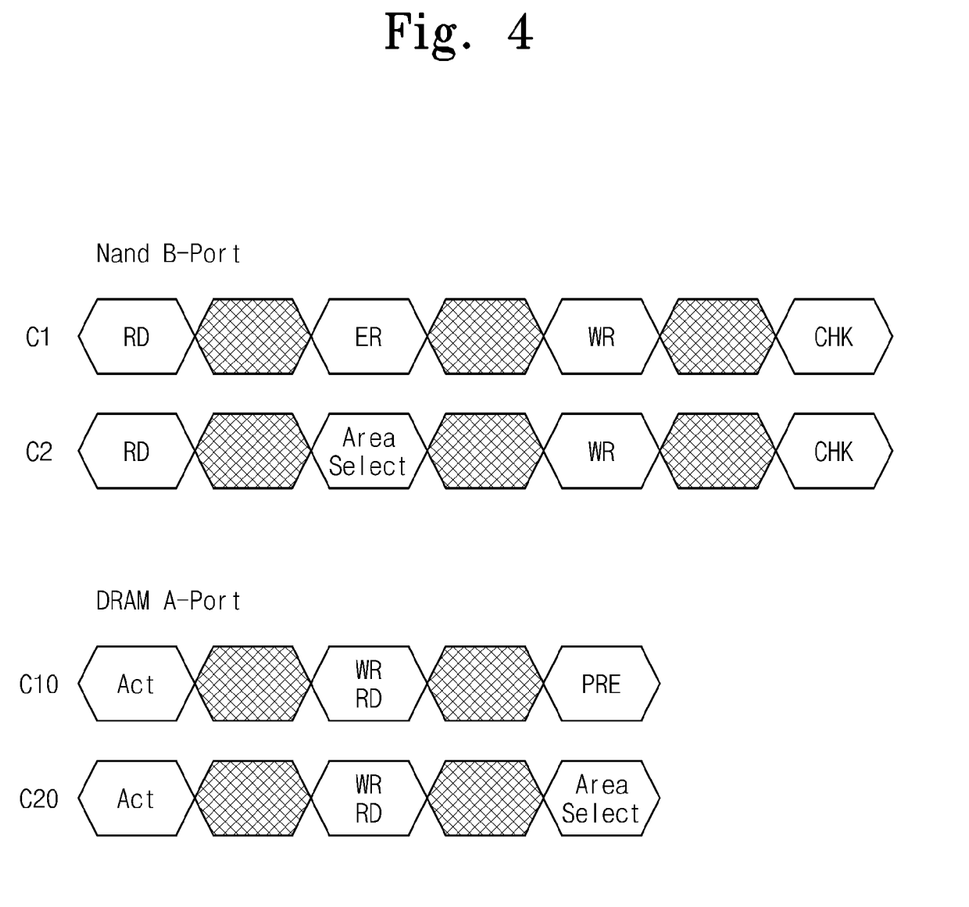
FIG. 4 is a timing diagram schematically illustrating exemplary commands applied to a semiconductor memory device of FIG. 1.

FIG. 4 is a timing diagram schematically illustrating exemplary commands applied to the semiconductor memory device of FIG. 1 through FIG. 3.

FIG. 4 illustrates commands for a first interface and commands for a second interface.

In FIG. 4, "C1" and "C2" indicate commands of the second interface such as a NAND interface NAND-INTF, and "C10" and "C20" indicate commands of the first interface such as a DRAM interface DRAM-INTF.

Referring to the commands C1, "RD", "ER", "WR", and "CHK" may be commands indicating reading, erasing, writing, and checking, respectively.

Referring to the commands C2, "Area Select" may be a command for selecting between the shared area 106, the first dedicated memory area 107, and second dedicated memory areas 108 and 109 of the MRAM array 110 as a storage memory.

Referring to the command C10, "Act", "WR/RD", and "PRE" may be commands indicating active, write/read, and pre-charge, respectively.

Referring to the command C20, "Area Select" may be a command for selecting between the shared area 106, the first dedicated memory area 107, and the second dedicated memory areas 108 and 109 of the MRAM array 110 as a main memory.

Figure 5:
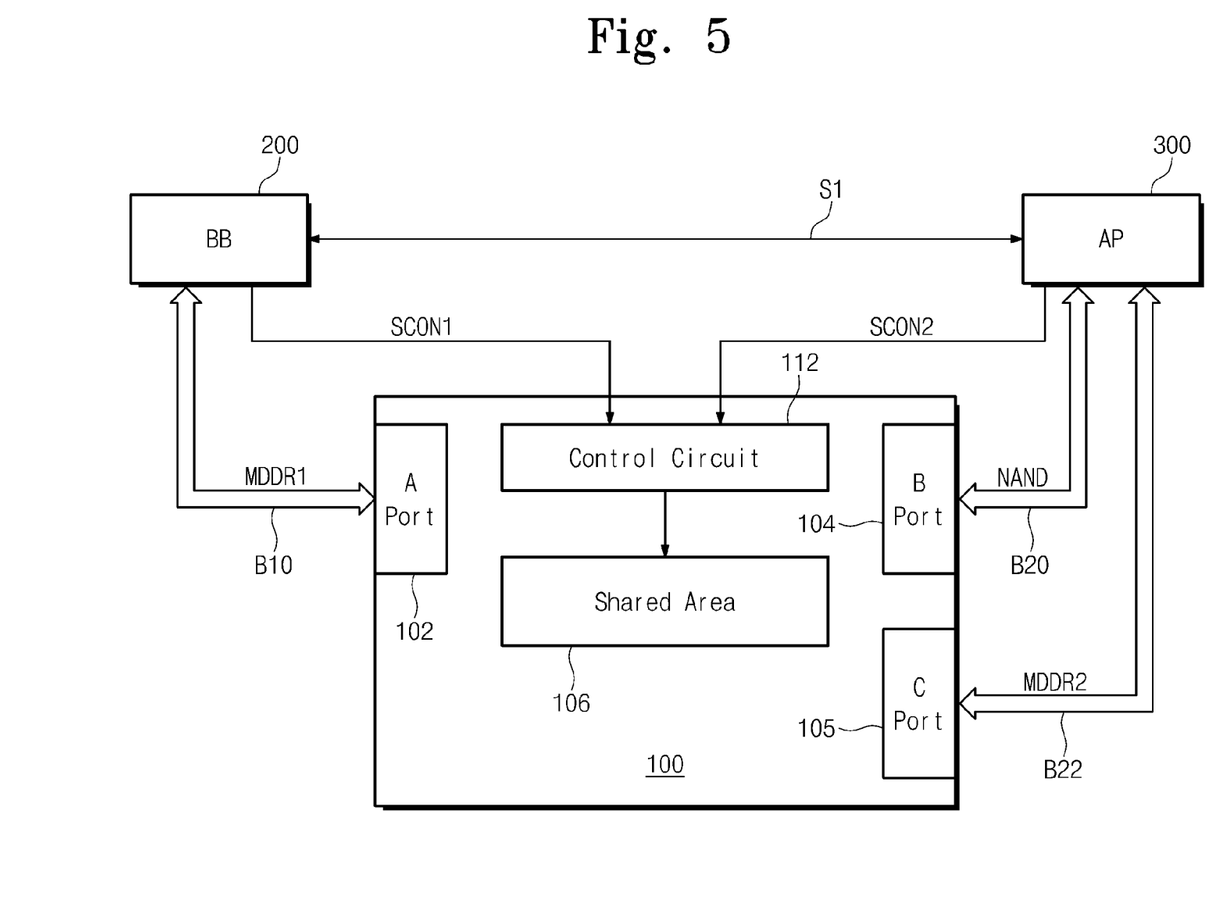
FIG. 5 is a block diagram schematically illustrating a semiconductor memory device according to another embodiment.

FIG. 5 is a block diagram schematically illustrating a semiconductor memory device according to another embodiment.

Referring to FIG. 5, there is illustrated an example in which a multi-port semiconductor memory device 100 having three ports is shared by a baseband processor 200 and an application processor 300.

The baseband processor 200 may be a communications processor, and may correspond to the first processor of FIG. 3.

The application processor 300 may be a processor for computation and application data processing, and may correspond to the second processor of FIG. 3.

Referring to FIG. 5, the multi-processor system may include the semiconductor memory device 100, the baseband processor 200, and the application processor 300.

The semiconductor memory device 100 may include an A port 102, a B port 104, a C port 105, a shared area 106, and a control circuit 112.

The baseband processor 200 may be connected with the A port 102 through a first bus B10. The application processor 300 may be connected with the B port 104 through a second bus B20. The application processor 300 may be connected with the C port 105 through a third bus B22.

A first DRAM interface MDDR1 may be provided to the A port 102.

A NAND interface NAND may be provided to the B port 104.

A second DRAM interface MDDR2 may be provided to the C port 105.

The baseband processor 200 may perform data communications with the application processor 300 through an interface line S1 such as UART.

The baseband processor 200 may be connected with the control circuit 112 through a first control line SCON1. Also, the application processor 300 may be connected with the control circuit 112 though a second control line SCON2.

As an MRAM type of semiconductor memory device, the semiconductor memory device 100 may include multiple ports and different interfaces to perform roles of a DRAM and a flash memory.

Since the semiconductor memory device 100, and in particular the shared area 106, with an MRAM array having a plurality of MRAM cells is accessed by processors through different interfaces, a data transfer time or path may be reduced or minimized when data is transferred between the processors. Thus, a latency time of a system may be reduced.

Also, since a memory device is used as two DRAMs and a flash memory, a size of the system may be scaled down, so that a cost necessary to implement the system is reduced. In addition, since it is used without changing interconnection between existing processors, the compatibility may be improved.

Figure 6:
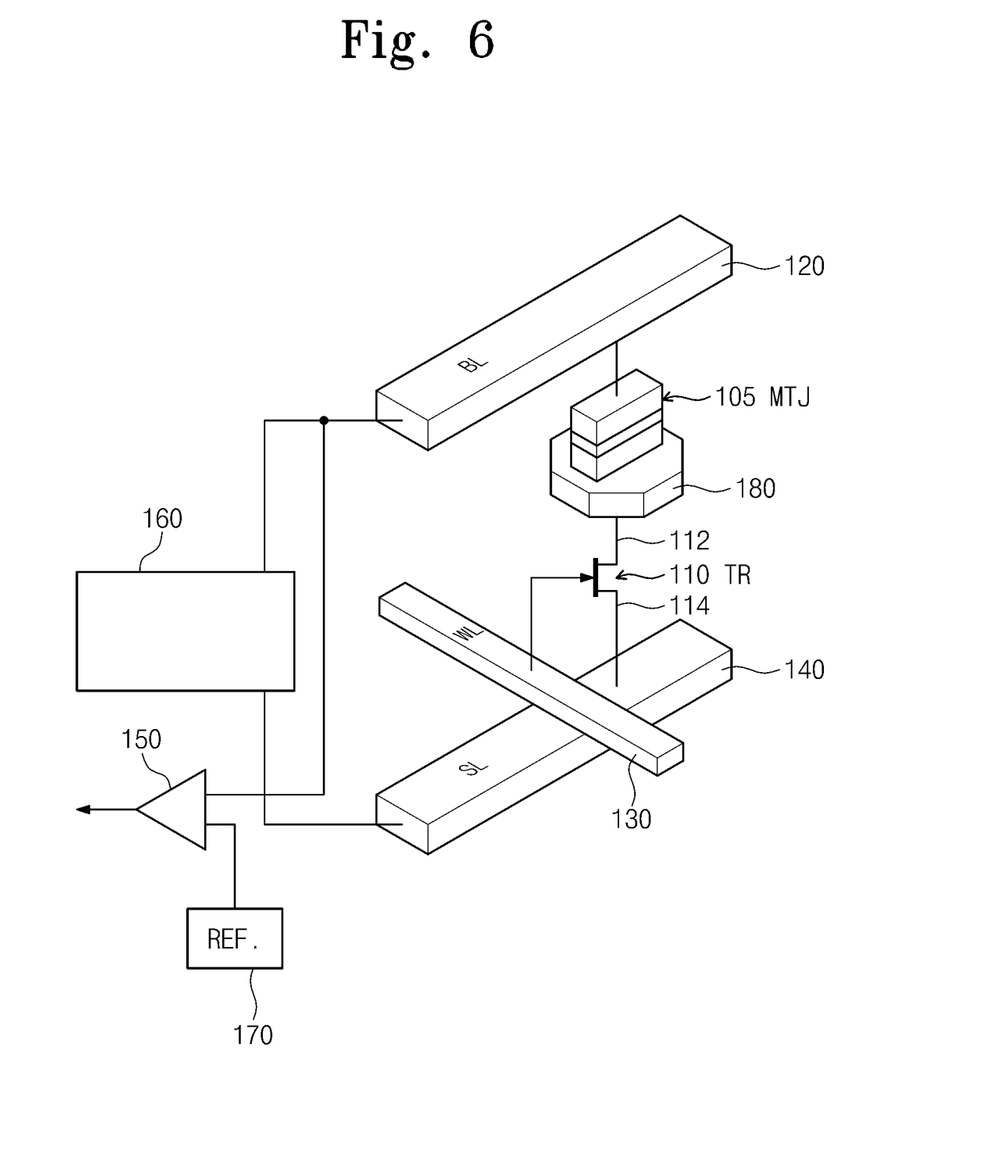
FIG. 6 is a diagram illustrating an operating principle of a memory cell.

FIG. 6 is a diagram illustrating an operating principle of a memory cell.

Referring to FIG. 6, a spin transfer torque magneto-resistive random access memory (STT-MRAM) cell may include a magnetic tunnel junction (MTJ) storage element 105, a transistor 110, a bit line 120, and a word line 130. For example, the MTJ storage element 105 may be formed of a pinned layer and a free layer separated by an insulation (tunnel barrier) layer and each having a magnetic field. A source line 140 may be connected with the transistor 110 through a line 114.

A sense amplifier 150 may compare a signal level of a bit line reference 170 and a signal level of a bit line 120 to amplify a comparison result (i.e., a difference between signal levels). A read/write circuit 160 may be connected between the bit line 120 and the source line 140.

The MTJ storage element 105 may be grown on a metal layer known as a bottom electrode (BE) plate 180, and the bottom electrode plate 180 may be connected to an upper portion 112 of the transistor 110 through a seed (not shown). Mechanical surface characteristics (e.g., flatness or roughness) of the bottom electrode plate 180 may influence the performance of the MTJ storage element 105. The bottom electrode plate 180 may be formed of stiff polished metal, for example, a titanium alloy having mechanical characteristics suitable to form it on the MTJ storage element 105 or metal similar thereto.

Figure 7:
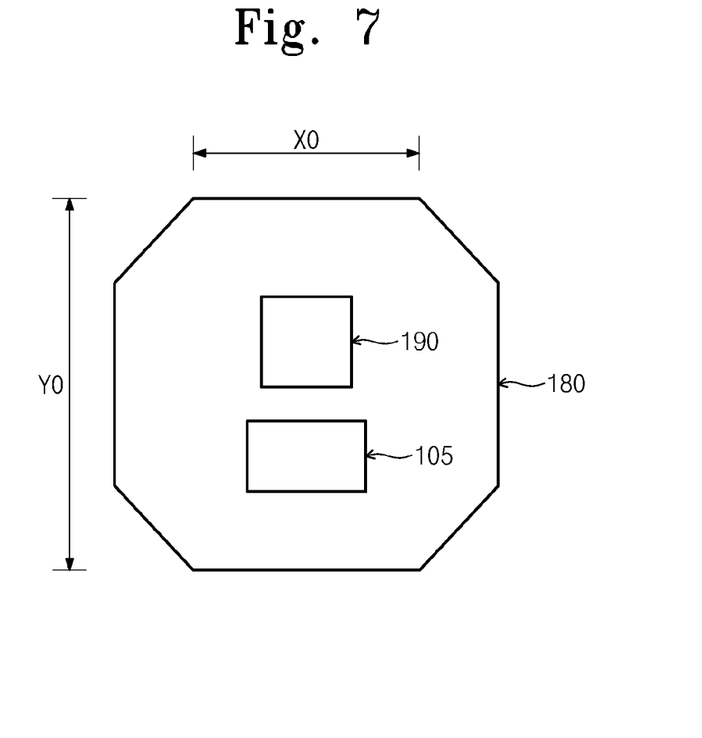
FIG. 7 is an exemplary top view of a memory cell of FIG. 6.
Figure 8:
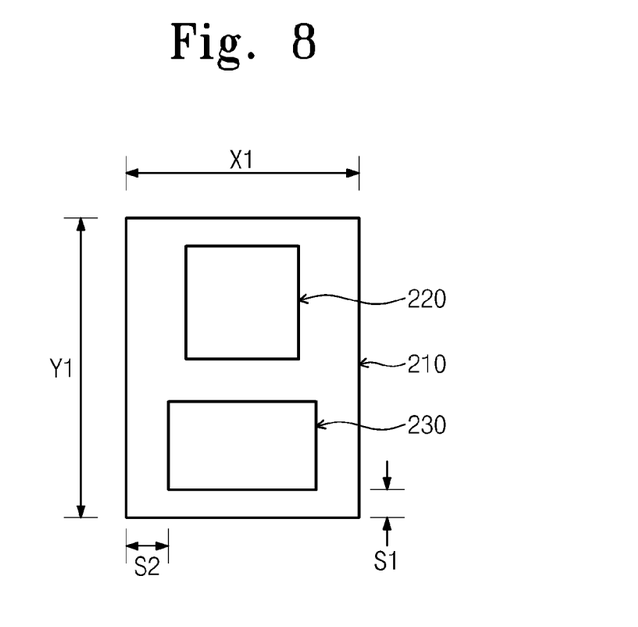
FIG. 8 is another exemplary top view of a memory cell of FIG. 6.

FIG. 7 is an exemplary top view of a memory cell of FIG. 6. FIG. 8 is another exemplary top view of a memory cell of FIG. 6.

Referring to FIG. 7, an STT-MRAM cell may include an MTJ storage element 105 formed on an octagonal bottom electrode plate 180. Also, the STT-MRAM cell may include a seed 190 connecting an upper portion of a transistor 110 and the bottom electrode plate 180.

As illustrated in FIG. 7, in typical asynchronous SST-MRAM cell array designs, corners of the bottom electrode plate 180 may be removed or etched to have an octagonal shape. This may be to reduce space requirements between adjacent BE plates at an STT-MRAM cell array. The octagonal BE plate 180 may have a width X0 and a length Y0. In general STT-MRAM cells, a BE plate width X0, an active layer width, and a metal widths may be different as illustrated in FIG. 7.

Referring to FIG. 8, there is illustrated another STT-MRAM cell including a rectangular bottom electrode (BE) 210, a seed 220, and an MTJ storage element 230. Unlike an octagonal BE plate of an STT-MRAM cell of FIG. 7, the BE plate 210 may have a rectangular shape. The rectangular BE plate 210 may have a width X1 and a length Y1. The width X1 and/or the length Y1 of the STT-MRAM may be increased or decreased. "S1" and "S2" may indicate minimum space requirements between an edge of the MTJ storage element 230 and an edge of the BE plate 210.

As illustrated in FIG. 8, in the event that there is provided a rectangular (e.g., square) BE plate 210 to be more approximate to a rectangular shape of the MTJ storage element 230, efficiency of an area of the STT-MRAM cell may be bettered. Since a width X1 of the rectangular BE plate of FIG. 8 is narrower than a width X0 of an octagonal BE plate, an area of the STT-MRAM cell may be reduced. Also, since a length Y1 of the rectangular BE plate of FIG. 8 is narrower than a length Y0 of an octagonal BE plate, an area of the STT-MRAM cell may be reduced.

An MRAM cell including a rectangular BE plate 210 and a storage element 230 on the rectangular BE plate 210 may be a bit cell of an STT-MRAM.

The MRAM may be a memory using such a characteristic that a spin is divided into up and down. That is, the MRAM may be a nonvolatile memory technique using magnetic characteristics. For example, the STT-MRAM may use electrons spin-polarized when the electrons penetrate a thin film (e.g., a spin filter). Also, the STT-MRAM may be divided into an STT-RAM, a spin momentum transfer RAM (SMT-RAM), and a spin transfer torque magnetisation switching RAM (Spin-RAM).

A typical MRAM using a magneto-resistance effect for changing resistance of a conductive material using a magnetic field may include a plurality of resistance memory cells formed by MTJ (Magnetic Tunnel Junction).

A tunneling current (or, tunneling resistance) flowing through the MTJ may vary according to a magnetization state of a ferromagnetic material. The ferromagnetic material may include a free layer and a pinned layer with the MTJ interposed therebetween. The tunneling resistance may be low when magnetization directions of the free and pinned layers are parallel and high when magnetization directions of the free and pinned layers are anti-parallel. In the event that an anti-ferromagnetic layer called a pinning layer is added to the pinned layer, a magnetization direction of the pinned layer may be fixed and the tunneling resistance may vary according to a magnetization direction of the free layer. Herein, the magnetization direction of the free layer may be switched using a magnetic field formed by currents flowing along a bit line and a word line. In the above-described method, as a resistive memory device is highly integrated, coercivity of the free layer may increase. This may cause unwanted switching of the free layer. Thus, there may be a growing interest in a magnetic memory device using a spin transfer torque manner or a magnetic memory device using a toggle switching writing manner.

The magnetic memory device using a spin transfer torque manner may switch a free layer in a required direction using a spin transfer of electron by providing a current in a direction where a spin is polarized. This may mean that the amount of current required is relatively reduced according to scale-down of a cell size. Thus, it is possible to integrate the resistive memory device highly.

A word line and a bit line may be disposed to be inclined by a 40° direction at an intersection, and MTJ may include a second magnetic area, a tunneling barrier, and a first magnetic area which are sequentially stacked. Herein, the first and second magnetic areas may include an SAF (Synthetic Anti-Ferromagnetic) structure which includes an upper ferromagnetic layer, a lower ferromagnetic layer, and a diamagnetic coupling spacer layer inserted between the upper ferromagnetic layer and the lower ferromagnetic layer.

Figure 9:
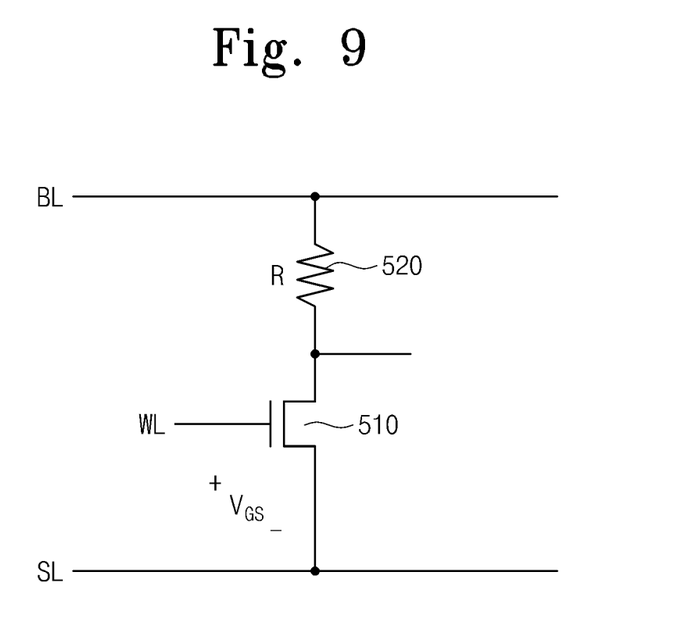
FIG. 9 is an equivalent circuit diagram of a memory cell of FIG. 6.

FIG. 9 is an equivalent circuit diagram of a memory cell of FIG. 6.

Referring to FIG. 9, an STT-MRAM cell may include a word line WL connected with an access transistor 510. A storage element (e.g., MTJ) 520 may be expressed by a resistor. The access transistor 510 and the storage element 520 may be disposed between a bit line BL and a source line SL. During a writing operation, a state "0" may be stored under the condition that WL=H, BL=H, and SL=L, and a state "1" may be stored under the condition that WL=H, BL=L, and SL=L. In example embodiments, "H" may be a high voltage/logic level, and "L" may be a low voltage/logic level. Voltage levels may be supply voltage levels (e.g., Vdd and 0V) or higher or lower than the supply voltage levels. Arrangement and state conditions may be exemplary. Therefore, the inventive concept is not limited thereto.

Figure 10:
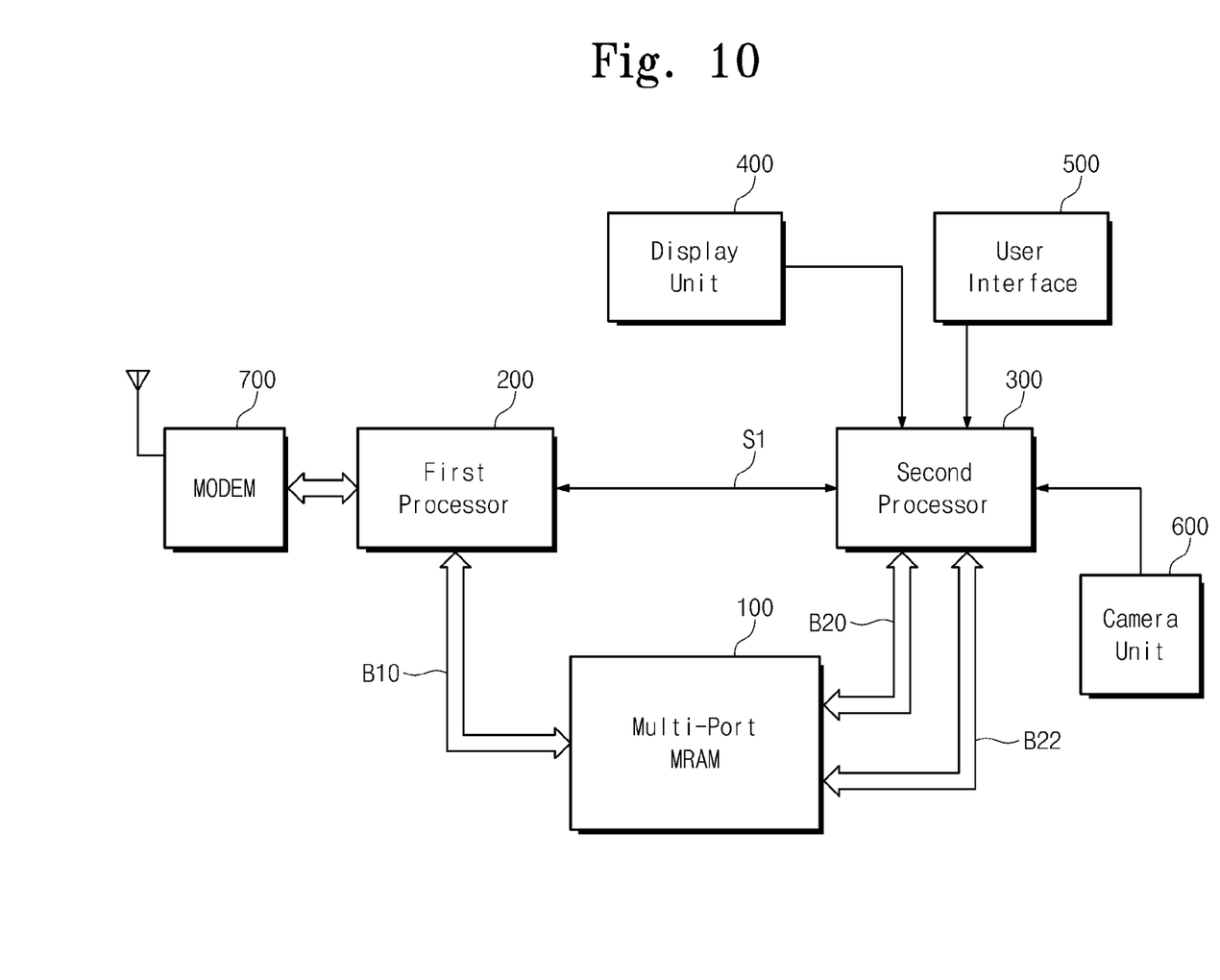
FIG. 10 is a block diagram schematically illustrating an exemplary application of the disclosed embodiments applied to a mobile device.

FIG. 10 is a block diagram schematically illustrating an exemplary application of the disclosed embodiments applied to a mobile device.

Referring to FIG. 10, a mobile device may include a multi-port MRAM 100, a first processor 200, a second processor 300, a display unit 400, a user interface 500, a camera unit 600, and a modem 700.

The multi-port MRAM 100, the first processor 200 and the second processor 300 may be connected as described with reference to FIG. 5. Thus, one multi-port MRAM 100 may a memory device which replaces a storage memory and two DRAMs.

The multi-port MRAM 100 of FIG. 10 may include three ports and different interfaces to perform roles of two DRAMs and a flash memory. Thus, since a data transfer time or path is minimized or reduced when data is transferred between processors, a latency time of the mobile device may be reduced. A decrease in the latency time may improve high-speed responsibility of the mobile device. Also, since a memory device is used as two DRAMs and a flash memory, a system size may be scaled down, so that a cost necessary to implement the system is reduced. In addition, since it is used without changing interconnection between existing processors, the compatibility may be bettered.

A first port of the multi-port MRAM 100 may be connected to the first processor 200 as a baseband processor through a first bus B10, and a second port thereof may be connected to a second processor 300 as an application processor through a second bus B20. Also, a third port of the multi-port MRAM 100 may be connected to the second processor 300 through a third bus B22.

An interface of the first bus B10 may be a DRAM interface, and the first port may receive first packet data DQ1/ADDR1/CMD1 generated from the first processor 200 to transfer them to an internal circuit block of the multi-port MRAM 100. Also, the first port may provide first data of the multi-port MRAM 100 to the first processor 200. In this case, the first data may be parallel data.

An interface of the third bus B22 may be a DRAM interface, and the third port may receive third packet data DQ3/ADDR3/CMD3 generated from the second processor 300 to transfer them to an internal circuit block of the multi-port MRAM 100. Also, the third port may provide third data of the multi-port MRAM 100 to the second processor 300. In this case, the first data may be serial data or parallel data. A clock generator (not shown) may generate a first internal clock signal ICLK1 and a third internal clock signal ICLK3 based on an external clock signal CLK. In this case, a frequency of the first internal clock signal ICLK1 may be different from that of the third internal clock signal ICLK3.

In some cases, the first and second processors 200 and 300 and the MRAM 100 may be integrated to a chip or packaged. In this case, the MRAM 100 may be embedded in the mobile device.

In the event that the mobile device is a handheld communications device, the first processor 200 may be connected with the modem 700 which transmits and receives communications data and modulates and demodulates data.

A NOR or NAND flash memory may be additionally connected to the first processor 200 or the second processor 300 to store mass information.

The display unit 400 may have a liquid crystal having a backlight, a liquid crystal having an LED light source, or a touch screen (e.g., OLED). The display unit 400 may be an output device for displaying images (e.g., characters, numbers, pictures, etc.) in color.

There is described an example in which the mobile device is a mobile communications device. In some cases, the mobile device may be used as a smart card by adding or removing components.

The mobile device may be connected with an external communications device through a separate interface. The communications device may be a DVD player, a computer, a set top box (STB), a game machine, a digital camcorder, or the like.

The camera unit 600 may include a camera image processor (CIS), and may be connected with the second processor 300.

Although not shown in FIG. 10, the mobile device may further include an application chipset, a camera image processor (CIS), a mobile DRAM, and so on.

An MRAM chip or a flash memory chip may be mounted independently or using various packages. For example, a chip may be packed by a package such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

In FIG. 10, there is illustrated an example in which an MRAM is installed at the mobile device. However, a variety of nonvolatile memories may be used instead of the MRAM.

The nonvolatile memory may store various types of data information such as texts, graphics, software codes, and so on.

The nonvolatile memory device may be EEPROM (Electrically Erasable Programmable Read-Only Memory), STT-MRAM (Spin-Transfer Torque MRAM), CBRAM (Conductive bridging RAM), FeRAM (Ferroelectric RAM), PRAM (Phase change RAM) called OUM (Ovonic Unified Memory), RRAM or ReRAM (Resistive RAM), nanotube RRAM, PoRAM (Polymer RAM), NFGM (Nano Floating Gate Memory), holographic memory, molecular electronics memory device), or insulator resistance change memory.

The semiconductor memory device 100 disclosed herein may be used as a memory which replaces a DRAM and a small-capacity flash memory, for example, in a mobile device such as in a cellular phone, a tablet PC, or a notebook computer.

Figure 11:
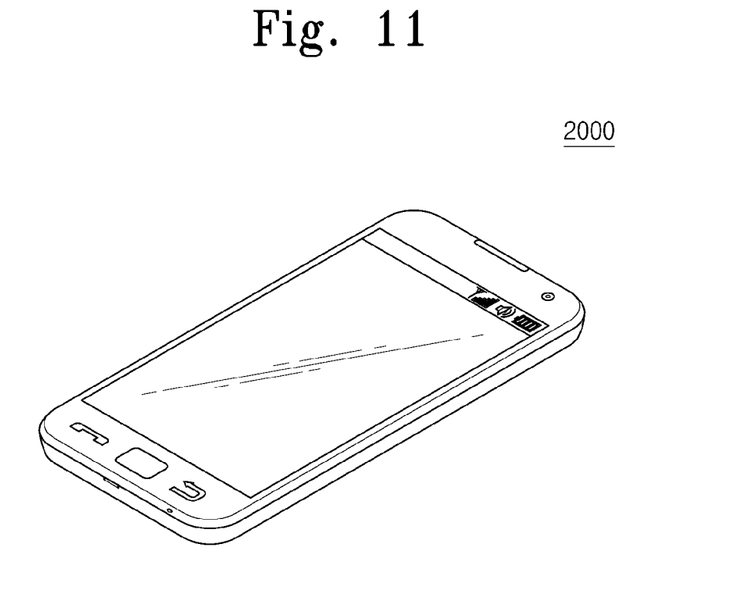
FIG. 11 is a diagram illustrating an exemplary application of the disclosed embodiments applied to a cellular phone.

FIG. 11 is a diagram illustrating an exemplary application of the disclosed embodiments applied to a cellular phone.

Referring to FIG. 11, a cellular phone 2000 may include the semiconductor memory device 100 disclosed herein, so that a DRAM and a small-capacity flash memory are removed. Thus, since a data transfer time or path is minimized or reduced, a latency time may be reduced. A decrease in the latency time may improve high-speed responsibility of the cellular phone. Also, since a memory device may be used as two DRAMs and a flash memory, a phone size may be scaled down, so that a cost necessary to implement the cellular phone is reduced.

Figure 12:
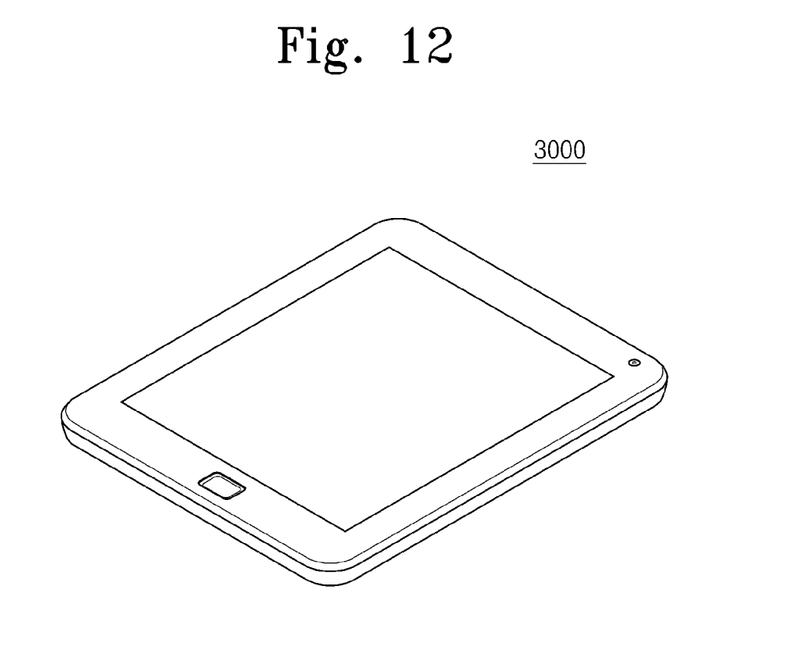
FIG. 12 is a diagram illustrating an exemplary application of the disclosed embodiments applied to a tablet PC.

FIG. 12 is a diagram illustrating an exemplary application of the disclosed embodiments applied to a tablet PC.

Referring to FIG. 12, a tablet PC 3000 may include the semiconductor memory device 100 disclosed herein, so that a DRAM and a small-capacity flash memory are removed. Thus, since a data transfer time or path is minimized or reduced, a latency time may be reduced. A decrease in the latency time may improve high-speed responsibility of the tablet PC. Also, since a memory device may be used as two DRAMs and a flash memory, a PC size may be scaled down, so that a cost necessary to implement the tablet PC is reduced.

Figure 13:
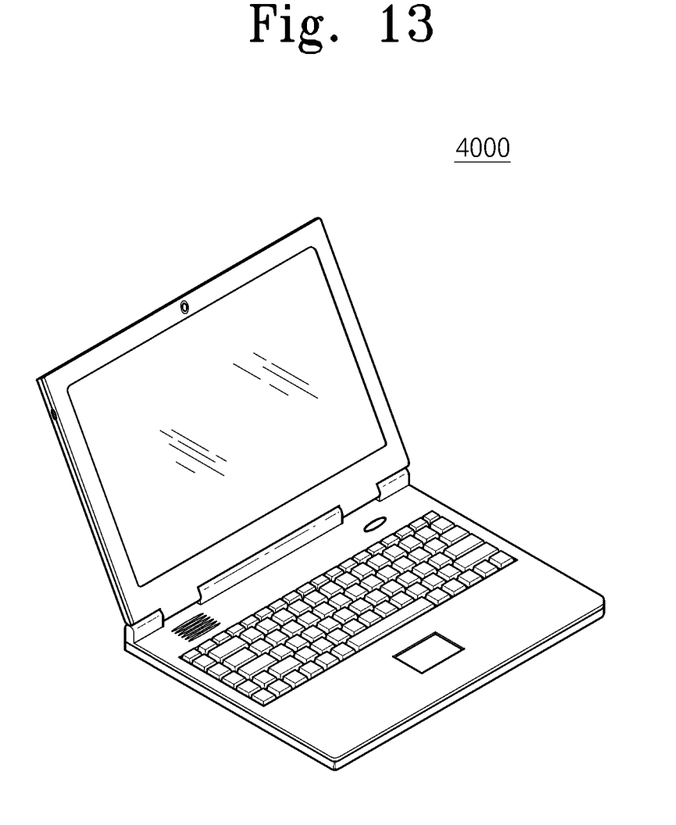
FIG. 13 is a diagram illustrating an exemplary application of the disclosed embodiments applied to a notebook computer.

FIG. 13 is a diagram illustrating an exemplary application of the disclosed embodiments applied to a notebook computer.

Referring to FIG. 13, a notebook computer 4000 may include the semiconductor memory device 100 disclosed herein, so that a DRAM and a small-capacity flash memory are removed. Thus, since a data transfer time or path is minimized or reduced, a latency time may be reduced. A decrease in the latency time may improve high-speed responsibility of the notebook computer. Also, since a memory device may be used as two DRAMs and a flash memory, a size of the notebook computer may be scaled down, so that a cost necessary to implement the notebook computer is reduced.

While the disclosure has been described with reference to exemplary embodiments, it will be apparent to those skilled in the art that various changes and modifications may be made without departing from the spirit and scope of the present invention. Therefore, it should be understood that the above embodiments are not limiting, but illustrative. For example, various changes and modifications on a manner of implementing different interfaces may be made without departing from the spirit and scope of the present invention.

What is claimed is:

1. A semiconductor memory device comprising:
   a first port configured to connect to a first processor by a first bus, and including a first interface circuit;
   a second port configured to connect to a second processor by a second bus, and including a second interface circuit; and
   a memory cell array including a first memory area connected to the first and second ports in common,
   wherein the first memory area includes a plurality of magneto-resistive random access memory (MRAM) cells, and
   wherein the first interface circuit is configured to convert first signals of the first bus, used in dynamic random access memory (DRAM) into second signals used in MRAM, and the second interface circuit is configured to convert third signals of the second bus, used in flash memory into fourth signals used in MRAM.

2. The semiconductor memory device of claim 1, further comprising:
   a control circuit connected to the memory cell array, and configured to adjust a number of memory cells included in the first memory area.

3. The semiconductor memory device of claim 1, wherein each of the magneto-resistive random access memory cells is a spin transfer torque magneto-resistive random access memory (STT-MRAM) cell.

4. The semiconductor memory device of claim 1, wherein the first signals of the first bus are DRAM interface signals used in a DRAM and the third signals of the second bus are flash memory interface signals used in either a NAND flash memory or a NOR flash memory.

5. The semiconductor memory device of claim 1, wherein the memory cell array further comprises a second memory area connected to the first port and not the second port, and a third memory area connected to the second port and not the first port.

6. The semiconductor memory device of claim 1, wherein the first processor is a baseband processor, and the second processor is an application processor.

7. The semiconductor memory device of claim 1, further comprising:
   a third port configured to connect to the second processor by a third bus, and including a third interface circuit,
   wherein the first memory area is connected to the third port.

8. A mobile device comprising:
   the semiconductor memory device of claim 7; and
   a display unit configured to connect to the second processor,
   wherein the semiconductor memory device is connected to the first and second processors.

9. The semiconductor memory device of claim 7, wherein the third interface circuit is configured to receive signals used in DRAM.

10. A semiconductor memory device comprising:
a first port including a first interface circuit, and configured to connect to a first processor;
a second port including a second interface circuit, and configured to connect to a second processor; and
a memory cell array including a plurality of magneto-resistive random access memory (MRAM) cells, and divided into first through third memory areas,
wherein the first memory area is connected to the first port and not the second port and the second memory area is connected to the second port and not the first port,
wherein the third memory area is connected to the first and second ports,
wherein the first interface circuit is configured to convert signals used in dynamic random access memory (DRAM) into signals used in MRAM, and
wherein the second interface circuit is configured to convert signals used in flash memory into signals used in MRAM.

11. The semiconductor memory device of claim 10, wherein each of the first through third memory areas includes a plurality of spin transfer torque magneto-resistive random access memory (STT-MRAM) cells arranged in a matrix of rows and columns.

12. The semiconductor memory device of claim 10, further comprising:
a third port including a third interface circuit, and configured to connect to the second processor,
wherein the third memory area is connected to the third port, and
wherein the third interface circuit is configured to convert signals used in DRAM into signals used in MRAM.

13. A mobile device comprising:
the semiconductor memory device of claim 12; and
a display unit configured to connect to the second processor,
wherein the semiconductor memory device is connected to the first and second processors.

14. The semiconductor memory device of claim 10, wherein the first processor is a baseband processor, and the second processor is an application processor for a multimedia device.

15. The semiconductor memory device of claim 10, further comprising:
a control circuit connected to the memory cell array, and configured to adjust a number of memory cells included in the third memory area.

16. A multi processor system comprising:
first and second processors; and
a semiconductor memory device connected to the first and second processors by first and second buses,
wherein the semiconductor memory device comprises:
a first port configured to connect to the first processor by the first bus, and including a first interface circuit,
a second port configured to connect to the second processor by the second bus, and including a second interface circuit, and
a memory cell array including a first memory area connected to the first and second ports in common,
wherein the first memory area includes a plurality of magneto-resistive random access memory (MRAM) cells, and
wherein the first interface circuit is configured to convert first signals of the first bus, used in dynamic random access memory (DRAM) into second signals used in MRAM, and the second interface circuit is configured to convert third signals of the second bus, used in flash memory into fourth signals used in MRAM.

17. The multi processor system of claim 16, wherein the semiconductor memory device further comprises:
a control circuit connected to the memory cell array, and configured to adjust a number of memory cells included in the first memory area.

18. The multi processor system of claim 16, wherein the semiconductor memory device further comprises:
a third port configured to connect to the second processor by a third bus, and including a third interface circuit,
wherein the first memory area is connected to the third port.

19. The multi processor system of claim 16, wherein the first processor is a baseband processor, and the second processor is an application processor.

* * * * *